(12) United States Patent
Nakaoka et al.

(10) Patent No.: US 7,015,554 B2
(45) Date of Patent: Mar. 21, 2006

(54) SEMICONDUCTOR DEVICE AND METHOD FOR FABRICATING THE SAME

(75) Inventors: Hiroaki Nakaoka, Kyoto (JP); Akio Sebe, Kanagawa (JP); Takayuki Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/756,465

(22) Filed: Jan. 14, 2004

(65) Prior Publication Data

US 2004/0183141 A1 Sep. 23, 2004

(30) Foreign Application Priority Data

Feb. 17, 2003 (JP) .............................. 2003-037809

(51) Int. Cl.
*H01L 29/94* (2006.01)
(52) U.S. Cl. .................. 257/392; 257/336; 257/344
(58) Field of Classification Search ................ 257/314, 257/392, 391, 288, 318, 336, 339, 337, 344, 257/903, 904
See application file for complete search history.

(56) References Cited

U.S. PATENT DOCUMENTS 6,642,589 B1 * 11/2003 Wada et al. ................. 257/397
6,667,524 B1 * 12/2003 Sakakibara .................. 257/391

FOREIGN PATENT DOCUMENTS

| JP | 11-163285 | 6/1999 |
|---|---|---|
| JP | 11-233729 | 8/1999 |
| JP | 2000-340791 | 12/2000 |
| JP | 2000-357792 | 12/2000 |
| JP | 2002-083941 | 3/2002 |
| JP | 2003-031682 | 1/2003 |

OTHER PUBLICATIONS

C. Chen, C.Y. Chang, J.W. Chou, C. T. Huang, K.C. Lin, Y. C. Cheng, and C. Y. Lin, "Optimization of Short Channel Effect by Arsenic P-Halo Implant Through Polysilicon Gate for 0.12 um P-MOSFET," Proc. IEDM 2000 (Jun. 24, 2000), pp. 44-47.*

* cited by examiner

*Primary Examiner*—Sara Crane
(74) *Attorney, Agent, or Firm*—McDermott Will & Emery LLP

(57) ABSTRACT

Impurities for threshold voltage adjustment are implanted using a resist film and a protective dielectric as implantation masks from directions inclined at 10° through 30° with respect to the direction vertical to the principal surface of a semiconductor substrate 1 when viewed in cross section taken along the gate width direction. Thus, first low-concentration impurity implantation regions are formed to overlap each other in the central part of an active region for a memory cell MIS transistor Mtrs of an SRAM. Furthermore, after an isolation is formed, a second low-concentration impurity implantation region is formed in an active region for each of MIS transistors Ltr, Mtrs and Mtrl by implanting impurity ions without using implantation masks. The MIS transistors Ltr, Mtrs and Mtrl formed after the completion of the fabricating process have substantially the same threshold voltage.

6 Claims, 6 Drawing Sheets

SEMICONDUCTOR DEVICE AND METHOD FOR FABRICATING THE SAME

BACKGROUND OF THE INVENTION

The present invention relates to a semiconductor device and a method for fabricating the same, and more particularly to a measure to restrain a reverse narrow channel effect from occurring in a transistor having a narrow gate width.

In recent years, for the purpose of reducing the cost of a semiconductor device (LSI), there has been a strong demand for increased density of an SRAM circuit placed in an LSI. In order to increase the density of the SRAM circuit, it is significant to shorten the gate length of a transistor that is an element of the SRAM circuit, but it is still unavoidable to reduce the width of an isolation isolating elements from one another. In order to reduce the isolation width, reduction in the gate width of the transistor has been indispensable.

As the gate width of a transistor is reduced, the reverse narrow channel effect that the threshold voltage drops becomes more significant. When the reverse narrow channel effect takes place, threshold voltages of transistors having different gate widths differ from one another, leading to variations in leakage current and saturation current and reduction in circuit performance (see, for example, Japanese Laid-Open Patent Publication No. 11-233729 (page 2, FIGS. 2 through 5)).

To cope with this, the following method for fabricating a semiconductor device has conventionally been employed as means for avoiding the reverse narrow channel phenomenon.

FIGS. 5A through 5E show known process steps for fabricating a semiconductor device in cross section taken along the gate width direction.

The semiconductor device shown in FIGS. 5A through 5E includes a logic circuit formation region Rlogc and a memory circuit formation region Rmemo. A logic MIS transistor Ltr having a wide gate width of approximately 0.4 $\mu$m is formed in the logic circuit formation region Rlogc. A memory cell MIS transistor Mtrs having a narrow gate width of approximately 0.1 $\mu$m and a peripheral MIS transistor Mtrl having a wide gate width of approximately 0.4 $\mu$m are formed in the memory circuit formation region Rmemo.

First, in a process step shown in FIG. 5A, an underlying oxide film 102 and a nitride film 103 are successively formed on the whole surface of a P-type semiconductor substrate 101, and thereafter a resist mask 104 is formed on the nitride film 103 to cover a region for forming an active region.

Next, in a process step shown in FIG. 5B, dry etching is performed on the nitride film 103 and the underlying oxide film 102 by using the resist film 104 as a mask so that a protective dielectric 103a and an underlying dielectric 102a are formed, and thereafter the resist film 104 is removed.

Next, in a process step shown in FIG. 5C, a known trench isolation formation process step allows the semiconductor substrate 101 to be partly etched away to a predetermined depth by dry etching using the protective dielectric 103a as a mask to form an isolation trench (not shown), and then an oxide film (HDP-NSG film) is deposited on the whole surface of the substrate by a high-density plasma method. Thereafter, parts of the HDP-NSG film located on the protective dielectric 103a are removed using a CMP method, and then the protective dielectric 103a and the underlying dielectric 102a are selectively removed by etching. This allows an isolation 105 to be formed by filling the isolation trench with the HDP-NSG film.

Next, in a process step shown in FIG. 5D, a protective film 106 made of an oxide film is formed on the active region of the semiconductor substrate 101, and then P-type impurities (for example, boron ($B^+$) or boron fluoride ($BF_2^+$)) are ion-implanted into the substrate 101 for the purpose of adjusting the threshold voltage of the logic MIS transistor Ltr, thereby forming a first low-concentration impurity implantation region 107 in the logic circuit formation region Rlogc. At this time, a first low-concentration impurity implantation region 107 is formed also in the memory circuit formation region Rmemo.

Next, in a process step shown in FIG. 5E, a resist film 108 is formed on the substrate to cover the logic circuit formation region Rlogc while the memory circuit formation region Rmemo is open. Thereafter, P-type impurities (for example, boron ($B^+$) or boron fluoride ($BF_2^+$)) are additionally ion-implanted into the substrate using the resist film 108 as a mask for the purpose of adjusting the threshold voltage of the memory cell MIS transistor Mtrs (i.e., the substrate is subjected to an additional ion implantation for adjusting the threshold voltage), thereby forming a second low-concentration impurity implantation region 109 in the memory circuit formation region Rmemo.

Thereafter, the resist film 108 is removed, and then the protective film 106 is removed. Thereafter, a gate dielectric, a gate electrode, source and drain regions, and the like are formed, whereby a logic MIS transistor having a wide gate width is formed in the logic circuit formation region Rlogc and a memory cell MIS transistor Mtrs having a narrow gate width and a peripheral MIS transistor Mtrl having a wide gate width are formed in the memory circuit formation region Rmemo. Impurities in the first and second low-concentration impurity implantation regions 107 and 109 are diffused using a thermal oxidation process, a Rapid Thermal Annealing (RTA) process for the activation of impurities or like processes, thereby forming first and second impurity diffusion regions.

According to this known method for fabricating a semiconductor device, reduction in the threshold voltage occurring in the transistor region where the gate width is narrow can be adjusted by the additional ion implantation. Thereby, the threshold voltage of the logic MIS transistor Ltr having a wide gate width and the threshold voltage of the memory cell MIS transistor Mtrs having a narrow gate width can be adjusted to become substantially the same.

SUMMARY OF THE INVENTION

In the above-described known method for fabricating a semiconductor device, as shown in FIG. 5E, impurities for threshold voltage adjustment are additionally ion-implanted into the memory circuit formation region Rmemo. This allows a threshold-voltage-adjusting impurity diffusion region of the logic MIS transistor Ltr having a wide gate width and a threshold-voltage-adjusting impurity diffusion region of the memory cell MIS transistor Mtrs having a narrow gate width to have substantially the same impurity concentration so that the transistors Ltr and Mtrs are adjusted to have substantially the same threshold voltage.

However, in the process step shown in FIG. 5E, a second low-concentration impurity implantation region 109 is formed also in the peripheral MIS transistor Mtrl formation region of the memory circuit formation region Rmemo. Therefore, the impurity concentration increases in the threshold-voltage-adjusting impurity diffusion region of the peripheral MIS transistor Mtrl, so that the threshold voltage of the peripheral MIS transistor Mtrl increases to become higher than that of the logic MIS transistor Ltr having the same gate width.

FIG. 6 is a graph showing the relationship between the gate width and the threshold voltage of the MIS transistors formed using the known art. As obvious from FIG. 6, the threshold voltage of each of the MIS transistors Mtrs and Mtrl located in the memory circuit formation region Rmemo totally becomes higher than that of the logic MIS transistor Ltr located in the logic circuit formation region Rlogc by the additional ion implantation. Therefore, although the logic MIS transistor Ltr and the memory cell MIS transistor Mtrs have substantially the same threshold voltage, the peripheral MIS transistor Mtrl has a higher threshold voltage than the logic MIS transistor Ltr (in the example shown in FIG. 6, a difference in the threshold voltage between the peripheral MIS transistor Mtrl and the logic MIS transistor Ltr is approximately 100 meV).

It is an object of the present invention to provide a semiconductor device including plural MIS transistors having different gate widths and capable of restraining the reverse narrow channel characteristics from occurring in a transistor having a narrow gate width, and provide a method for fabricating the same.

A semiconductor device of the present invention comprises: a semiconductor substrate including a first active region; and a first MIS transistor provided in the first active region and including a first gate width, wherein the first MIS transistor includes a threshold-voltage-adjusting impurity diffusion region including two first impurity diffusion regions that contain first conductivity type impurities and come into contact with each other in the central part of the first active region when viewed in cross section taken along the gate width direction.

Therefore, the threshold voltage of the first MIS transistor having so small a first gate width as is likely to cause a reverse narrow channel phenomenon can be easily adjusted utilizing ion implantation from two directions inclined at large tilt angles.

The threshold-voltage-adjusting impurity diffusion region of the first MIS transistor further includes a second impurity diffusion region containing first conductivity type impurities with a substantially uniform concentration. Therefore, the impurity concentration can be controlled more finely.

The semiconductor substrate includes a second active region; a second MIS transistor having a second gate width wider than the first gate width is provided in the second active region; and the second MIS transistor includes two first impurity diffusion regions containing first conductivity type impurities and located apart from each other with the central part of the second active region interposed therebetween when viewed in cross section taken along the gate width direction, and a second impurity implantation region containing first conductivity type impurities with a substantially uniform concentration. Therefore, even when the degree of decrease of the impurity concentration in the first active region resulting from absorption of the first conductivity type impurities into an isolation is larger than the degree of decrease of the impurity concentration in the second active region resulting from absorption of the first conductivity type impurities into the isolation, the threshold voltages of the first and second MIS transistors can be adjusted to be generally equivalent to each other while the reverse narrow channel phenomenon is suppressed.

The semiconductor substrate includes a third active region; a third MIS transistor having a third gate width wider than the first gate width is provided in the third active region; and the third MIS transistor includes a threshold-voltage-adjusting impurity diffusion region having a second impurity implantation region that contains first conductivity type impurities with a substantially uniform concentration. Therefore, the threshold voltages of the first, second and third MIS transistors can be adjusted to be generally equivalent to one another.

The semiconductor device comprises an SRAM including a memory cell region and a peripheral circuit, and a logic circuit; the first MIS transistor is a memory cell transistor arranged in the memory cell region of the SRAM; the second MIS transistor is a peripheral transistor arranged in the peripheral circuit of the SRAM; and the third MIS transistor is a logic MIS transistor arranged in the logic circuit. Therefore, the threshold voltage of an SRAM-and-logic-embedded semiconductor device that is in particular required to become finer and includes a memory cell MIS transistor having a small gate width can be appropriately adjusted.

A method for fabricating a semiconductor device of the present invention comprises the steps of: (a) forming, on a semiconductor substrate, a protective dielectric that covers a first active region for a first MIS transistor and includes an opening in a part of the protective dielectric located above an isolation formation region surrounding the first active region; (b) ion-implanting impurities for threshold voltage adjustment from two directions inclined to be opposite to each other with respect to the direction vertical to the principal surface of the semiconductor substrate when viewed in cross section taken along the gate width direction, thereby forming two first impurity implantation regions coming into contact with each other in the central part of the first active region; (c) forming an isolation trench surrounding the first active region by etching the semiconductor substrate using the protective dielectric as a mask after the step (b), and thereafter forming an isolation by filling the isolation trench with a dielectric.

According to this method, in the step (b), the threshold voltage of the first MIS transistor having so small a first gate width as is likely to cause a reverse narrow channel phenomenon can be easily adjusted by utilizing ion implantation from two directions inclined at large tilt angles with the use of the protective dielectric for forming an isolation trench as an implantation mask.

The method for fabricating a semiconductor device further comprises the steps of: (d) removing the protective dielectric after the step (c); (e) ion-implanting impurities for threshold voltage adjustment into the first active region after the step (d) to form a second impurity implantation region having a substantially uniform impurity concentration. Therefore, the threshold voltage of the first MIS transistor can be adjusted more finely.

In the step (a), the protective dielectric is formed to cover a second active region for a second MIS transistor having a second gate width wider than the first gate width and have an opening in a part of the protective dielectric located above an isolation formation region surrounding the second active region; in the step (b), two first impurity implantation regions are formed in the second active region so as to be located apart from each other with the central part of the second active region interposed therebetween; in the step (c), the isolation trench and the isolation are formed to surround the second active region; and in the step (e), the impurities for threshold voltage adjustment are ion-implanted to form a second impurity implantation region having a substantially uniform impurity concentration in the second active region. Therefore, ion implantation using a common implantation mask enables the first and second MIS transistors having different gate widths to be controlled to be generally equivalent to each other while it enables the reverse narrow channel phenomenon to be suppressed in the first MIS transistor.

In the step (a), the protective dielectric is formed to cover a third active region for a third MIS transistor having a third gate width wider than the first gate width and have an opening in a part of the protective dielectric located above an isolation formation region surrounding the third active region; in the step (b), a resist mask is formed to cover at least the third active region, and thereafter the impurities for threshold voltage adjustment are ion-implanted using the protective dielectric and the resist mask as masks; in the step (c), the resist mask is removed, and thereafter the isolation trench and the isolation are formed to surround the third active region; and in the step (e), the impurities for threshold voltage adjustment are ion-implanted to form a second impurity implantation region having a substantially uniform impurity concentration in the third active region. Therefore, the threshold voltages of the first, second and third MIS transistors can be adjusted to be generally equivalent to one another.

A memory cell transistor is formed as the first MIS transistor so as to be located in a memory cell region of an SRAM; a peripheral transistor is formed as the second MIS transistor so as to be located in a peripheral circuit of the SRAM; and a logic MIS transistor is formed as the third MIS transistor so as to be located in a logic circuit. Therefore, there can be provided a method for fabricating an SRAM-and-logic-embedded semiconductor device that is in particular required to become finer and includes a memory cell MIS transistor having a small gate width so that the threshold voltage of the device can be appropriately adjusted.

DETAILED DESCRIPTION OF THE INVENTION

Figure 1:
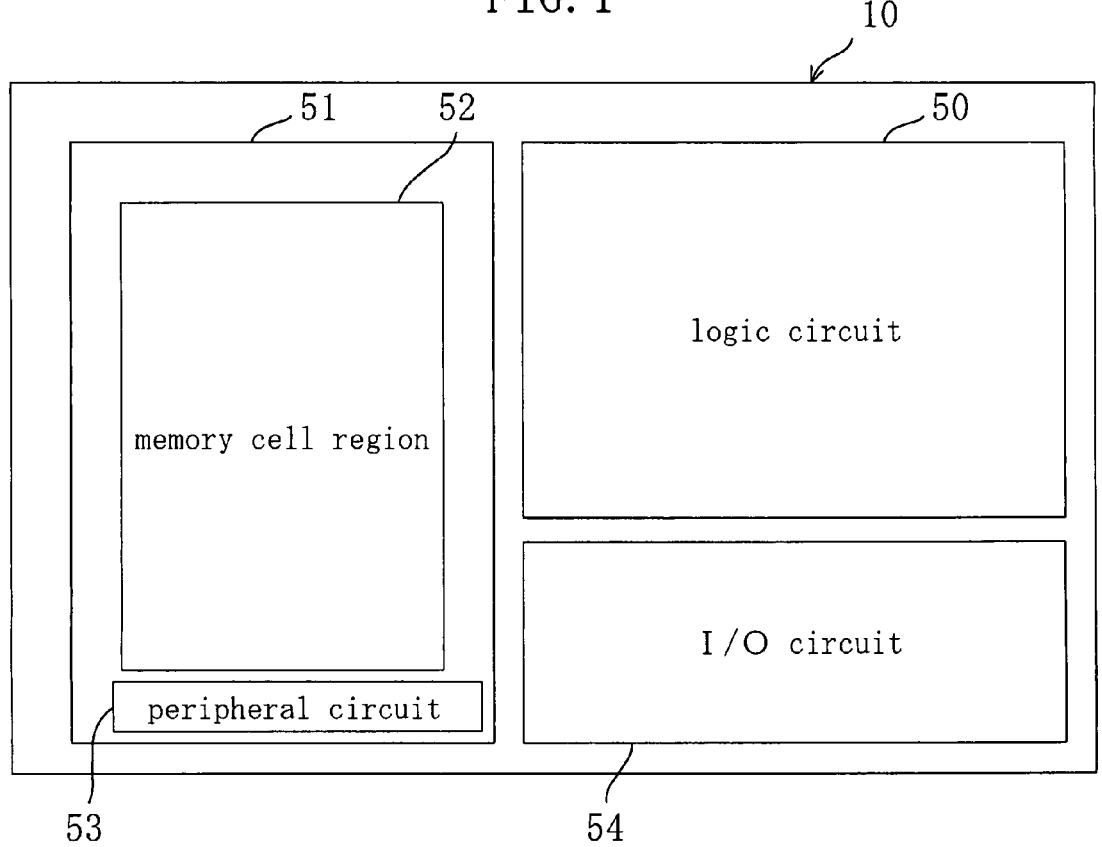
FIG. 1 is a plan view of a semiconductor device according to an embodiment of the present invention.

FIG. 1 is a plan view of a semiconductor device according to an embodiment of the present invention. As shown in FIG. 1, a semiconductor device 10 of the present invention comprises a logic circuit 50 for performing various kinds of operations and controls, an SRAM 51 including a memory cell region 52 and a peripheral circuit 53, and an I/O circuit 54 for inputting/outputting signals between each of the logic circuit 50 and SRAM 51 and an external device.

FIGS. 2A through 2E show process steps for fabricating the semiconductor device 10 according to the embodiment of the present invention in cross section taken along the gate width direction.

As shown in FIG. 2A through 2E, the semiconductor device of this embodiment includes a logic circuit formation region Rlogc and a memory circuit formation region Rmemo. A logic MIS transistor Ltr having a wide gate width of approximately 0.4 μm is formed in an active region Rac of the logic circuit formation region Rlogc, and a memory cell MIS transistor Mtrs having a narrow gate width of approximately 0.1 μm and a peripheral MIS transistor Mtrl having a wide gate width of approximately 0.4 μm are formed in two active regions Rac of the memory circuit formation region Rmemo, respectively.

Figure 2A:
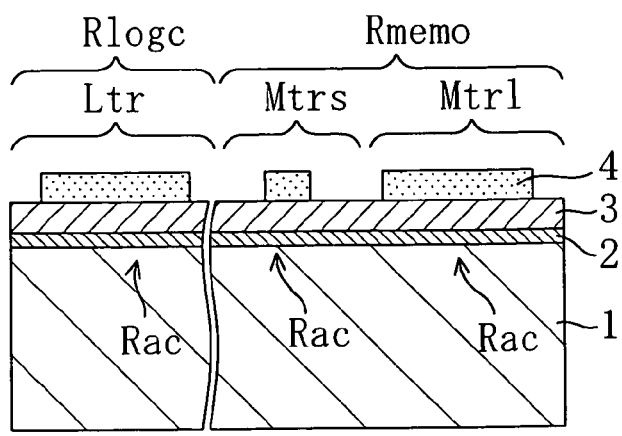
FIGS. 2A through 2E show process steps for fabricating a semiconductor device according to the embodiment of the present invention in cross section taken along the gate width direction.

First, in a process step shown in FIG. 2A, an oxide film 2 having a thickness of 20 nm and a nitride film 3 having a thickness of 100 nm are successively formed on the whole surface of a P-type semiconductor substrate 1. Thereafter, a resist film 4 is formed on the nitride film 3 to cover each of the active regions Rac for the MIS transistors and have an opening above a substrate region (isolation formation region) where an isolation is to be formed to surround each of the active regions.

Figure 2B:
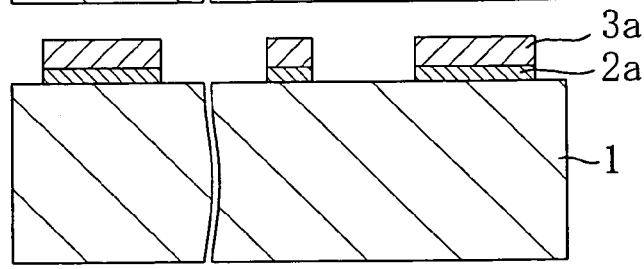

Next, in a process step shown in FIG. 2B, the nitride film 3 and the oxide film 2 are patterned by dry etching using the resist film 4 as a mask so that a protective dielectric 3a (etching mask) and an underlying dielectric 2a are formed to cover each of the active regions Rac for the MIS transistors and have an opening above the substrate region (isolation formation region) where an isolation is to be formed. Thereafter, the resist film 4 is removed.

Figure 2C:
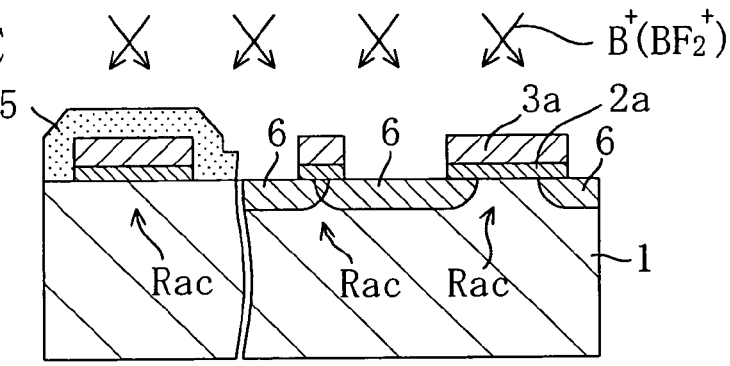

Next, in a process step shown in FIG. 2C, a resist film 5 is formed on the substrate to have an opening above the memory circuit formation region Rmemo and cover the logic circuit formation region Rlogc. Thereafter, P-type impurities (for example, boron ($B^+$) or boron fluoride ($BF_2^+$)) are ion-implanted into the substrate 1 using the resist film 5 and the protective dielectric 3a as implantation masks for the purpose of adjusting the threshold voltage of the memory cell MIS transistor Mtrs (i.e., the substrate 1 is subjected to ion implantation with impurities for threshold voltage adjustment), thereby forming a first low-concentration impurity implantation region 6 in each of the active regions Rac of the memory circuit formation region Rmemo. In this case, when viewed in cross section taken along the gate width direction, the P-type impurities are ion-implanted from directions inclined at about 10° through 30° with respect to the direction vertical to the principal surface of the semiconductor device under the conditions in which the ion acceleration energy is 10 through 30 keV, the dose of ions is $1 \times 10^{12} cm^{-2}$ through $1 \times 10^{13} cm^{-2}$ and this process is carried out through 4 steps.

At this time, the ions are implanted into the active region Rac for the memory cell MIS transistor Mtrs located in the memory circuit formation region Rmemo such that when viewed in cross section taken along the gate width direction, two first low-concentration impurity implantation regions 6 are formed by ion implantation from two directions that are inclined opposite to each other with respect to the direction vertical to the principal surface of the semiconductor device 1 to overlap each other below the protective dielectric 3a and the underlying dielectric 2a. In this case, an appropriate tilt angle for ion implantation depends on the thickness of each of the protective dielectric 3a and the underlying dielectric 2a. Typically, the angle is preferably 10° through 30° both inclusive. Furthermore, when viewed in cross section taken along the gate width direction, two first low-concentration impurity implantation regions 6 are respectively formed also in the substrate regions located below the ends of the protective dielectric 3a in the active region Rac for the peripheral MIS transistor Mtrl located in the memory circuit formation region Rmemo. These two first low-concentration impurity implantation regions 6 are located apart from each other with the central part of the active region Rac interposed therebetween. On the other hand, the logic circuit formation region Rlogc is covered with the resist film 5 during ion implantation, and therefore no low-concentration impurity implantation region is formed therein.

In this case, since four-step ion implantation is performed in forming the first low-concentration impurity implantation regions 6 in the process step shown in FIG. 2C, first low-concentration impurity implantation regions 6 are formed also in parts of the substrate located in the vicinity of an isolation 7 when viewed in cross section that is different from the cross section shown in FIG. 2C and is taken along the gate length direction. That is, a total of four first low-concentration impurity implantation regions 6 are formed. However, when viewed in cross section taken along the gate length direction, the first low-concentration impurity implantation regions 6 are formed only alongside the substrate regions where source and drain regions are to be formed, and both the first low-concentration impurity implantation regions 6 formed in the cross section taken along the gate length direction will be changed into N-type by implantation of second conductivity type impurities (N-type impurities such as arsenic or phosphorus) in the later formation of the source and drain regions. Therefore, the presence of threshold-voltage-adjusting impurity implantation regions viewed in cross section taken along the gate length need not be considered.

Figure 2D:
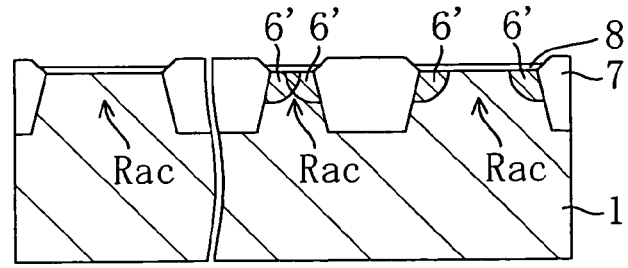

Next, in a process step shown in FIG. 2D, after the resist film 5 is removed, a known trench isolation formation process is carried out, wherein part of the semiconductor substrate 1 is etched away to a predetermined depth (for example, a depth of 250 through 300 nm) by dry etching using the protective dielectric 3a as a mask to form an isolation trench, and then a silicon oxide film (HDP-NSG film) having a thickness of 600 nm is deposited on the whole surface of the semiconductor substrate 1 by a high-density plasma method. Thereafter, part of the HDP-NSG film located on the protective dielectric 3a is removed by a planarization process using CMP, and then the protective dielectric 3a and the underlying dielectric 2a are selectively removed. This allows the isolation trench to be filled with the HDP-NSG film to form an isolation 7 surrounding the active regions Rac. Thereafter, thermal oxidation is performed on the semiconductor substrate 1, thereby forming a protective film 8 made of a silicon oxide film on the active regions Rac of the semiconductor substrate 1. Since the P-type impurities (for example, boron) implanted into the semiconductor substrate 1 are diffused during this thermal oxidation, first low-concentration impurity diffusion regions 6' are formed in which the impurities in the first low-concentration impurity implantation regions 6 have been diffused.

Figure 2E:
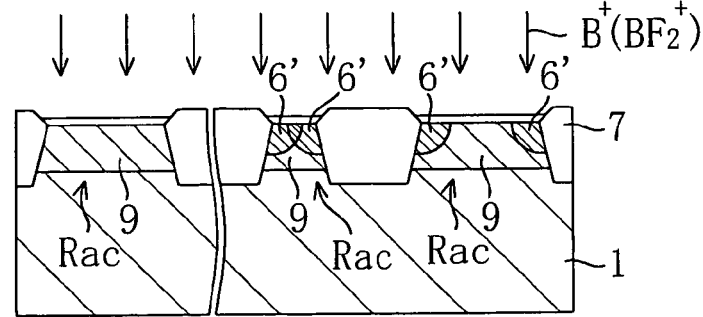

Next, in a process step shown in FIG. 2E, P-type impurities (for example, boron (B$^+$) or boron fluoride (BF$_2^+$)) are ion-implanted into the semiconductor substrate 1 for the purpose of adjusting the threshold voltage of the logic MIS transistor Ltr (i.e., the substrate is subjected to ion implantation for threshold voltage adjustment), thereby forming a second low-concentration impurity implantation region 9 in the logic circuit formation region Rlogc. In this case, the P-type impurities are ion-implanted from the direction substantially vertical to the principal surface of the semiconductor substrate 1 (at a tilt angle of 7° or less) under the conditions in which the ion acceleration energy is 10 through 30 keV and the dose of ions is $1 \times 10^{12} \text{cm}^{-2}$ through $1 \times 10^{14} \text{cm}^{-2}$.

Immediately after this ion implantation, in the active region Rac for the memory cell MIS transistor Mtrs located in the memory circuit formation region Rmemo, there coexist the two first low-concentration impurity diffusion regions 6', which contain boron as a first conductivity type impurity and extend from either end of the active region Rac to overlap each other in the central part of the active region Rac when viewed in cross section taken along the gate width direction, and a second low-concentration impurity implantation region 9 which contains boron as a first conductivity type impurity with a substantially uniform concentration.

In the active region Rac for the peripheral MIS transistor Mtrl located in the memory circuit formation region Rmemo, there coexist the two first low-concentration impurity diffusion region 6', which extend from either end of the active region Rac so as to be located apart from each other with the central part of the active region Rac interposed therebetween when viewed in cross section taken along the gate width direction, and a second low-concentration impurity implantation region 9 which contains boron as a first conductivity type impurity with a substantially uniform concentration.

On the other hand, a second low-concentration impurity implantation region 9 containing boron as a first conductivity type impurity with a substantially uniform concentration exists in the active region Rae for the logic MIS transistor Ltr located in the logic circuit formation region Rlogc.

Thereafter, the protective film 6 is removed, and then a gate dielectric, a gate electrode, source and drain regions, and the like are formed, whereby a logic MIS transistor Ltr having a wide gate width is formed in the logic circuit formation region Rlogc and a memory cell MIS transistor Mtrs having a narrow gate width and a peripheral MIS transistor Mtrl having a wide gate width are formed in the memory circuit formation region Rmemo. At this time, the impurities in the second low-concentration impurity implantation region 9 are also diffused while being activated, thereby forming a second low-concentration impurity diffusion region 9' (see FIG. 3A).

Although the cross sectional views shown in FIGS. 2A through 2E illustrate only N-channel MIS transistors, each circuit is also provided with P-channel MIS transistors. However, the P-channel MIS transistors are not shown in this embodiment for the following reason: in P-channel MIS transistors, the threshold-voltage-adjusting impurity diffusion region is doped with n-type impurities such as arsenic, and in the case of N-type impurities, particularly arsenic, the more remarkable the reverse narrow channel phenomenon becomes, the less likely the N-type impurities are to be drawn into an isolation dielectric.

Figure 3A:
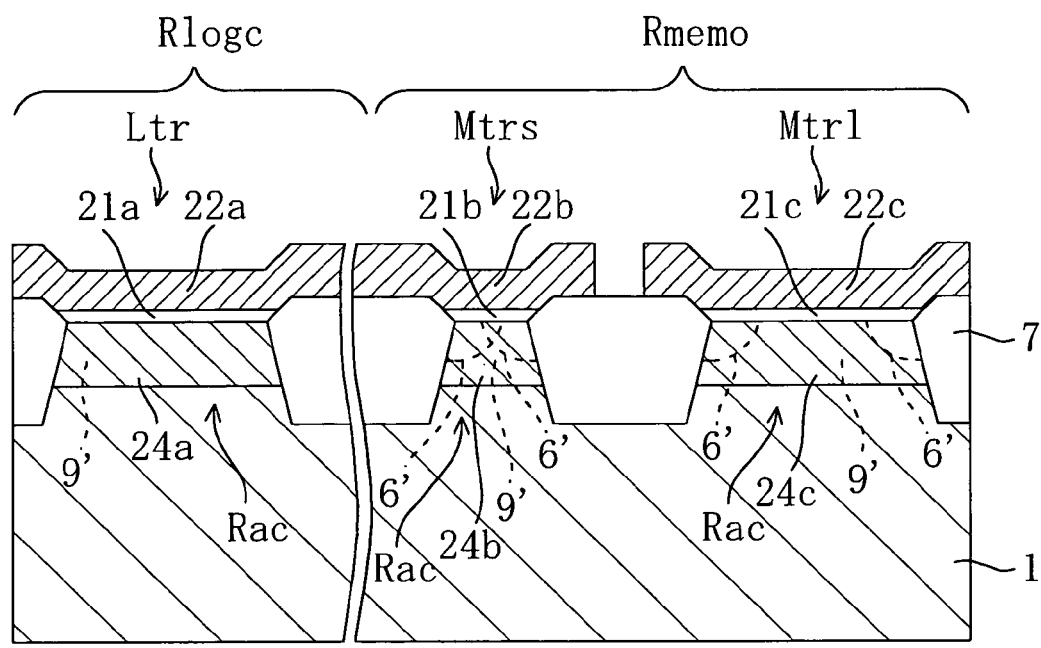
FIGS. 3A and 3B show the structure of a semiconductor device formed after the process steps for fabricating the same according to the embodiment of the present invention in cross section taken along the gate width direction and along the gate length direction, respectively.
Figure 3B:
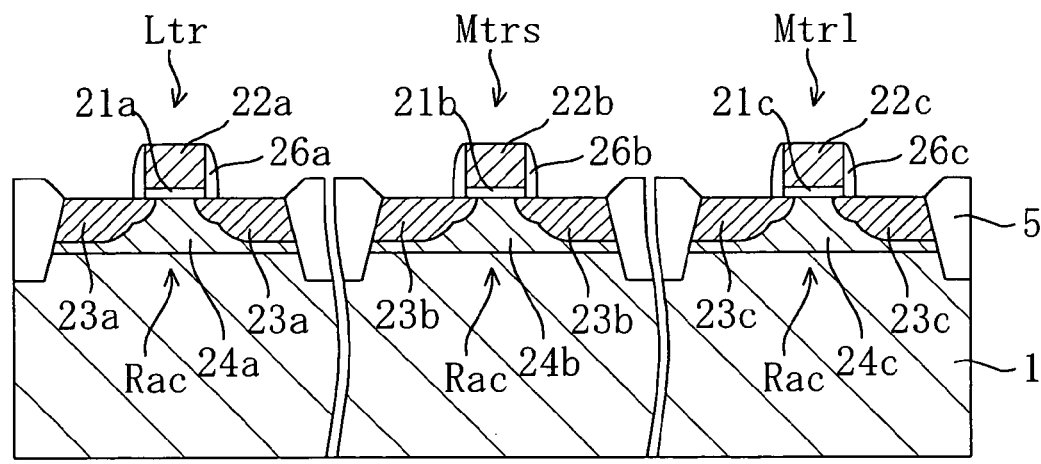

FIGS. 3A and 3B show the structure of a semiconductor device formed after the above process steps in cross section taken along the gate width direction and along the gate length direction, respectively. Although FIGS. 3A and 3B show only N-channel MIS transistors, each circuit is also provided with P-channel MIS transistors.

As shown in FIGS. 3A and 3B, the logic MIS transistor Ltr located in the logic circuit formation region Rlogc includes a gate dielectric 21a provided on a semiconductor substrate 1 and made of a 2 nm-thick silicon oxide film, a gate electrode 22a whose gate length is 0.1 µm and that is provided on the gate dielectric 21a and made of a polysilicon film, a sidewall 26a covering the sides of the gate electrode 22a, source and drain regions 23a provided in the regions of the semiconductor substrate 1 located to both sides of the gate electrode 22a and containing N-type impurities, and a threshold-voltage-adjusting impurity diffusion region 24a provided between the source and drain regions 23a and containing P-type impurities with a concentration of $7 \times 10^{17}$ atoms·cm$^{-3}$. The source/drain region 23a is composed of an extension region containing N-type impurities with a concentration of $1 \times 10^{20}$ atoms·cm$^{-3}$ and a high-concentration source/drain region containing N-type impurities with a concentration of $1 \times 10^{21}$ atoms·cm$^{-3}$. A second low-concentration impurity diffusion region 9' containing a first conductivity type impurity (boron) that has diffused from the second low-concentration impurity implantation region 9 with a substantially uniform concentration exists in the threshold-voltage-adjusting impurity diffusion region 24a.

The memory cell MIS transistor Mtrs located in the memory circuit formation region Rmemo includes a gate dielectric 21b provided on the semiconductor substrate 1 and made of a 2 nm-thick silicon oxide film, a gate electrode 22b whose gate length is 0.1 µm and that is provided on the gate dielectric 21b and made of a polysilicon film, a sidewall 26b covering the sides of the gate electrode 22b, source and drain regions 23b provided in the regions of the semiconductor substrate 1 located to both sides of the gate electrode 22a and containing N-type impurities, and a threshold-voltage-adjusting impurity diffusion region 24b (including a channel region) provided between the source and drain regions 23b and containing P-type impurities with a concentration of $9 \times 10^{17}$ atoms·cm$^{-3}$. The source/drain region 23b is composed of an extension region containing N-type impurities with a concentration of $1 \times 10^{20}$ atoms·cm$^{-3}$ and a high-concentration source/drain region containing N-type impurities with a concentration of $1 \times 10^{21}$ atoms·cm$^{-3}$. In the threshold-voltage-adjusting impurity diffusion region 24b, there coexist two first low-concentration impurity diffusion regions 6' containing boron as a first conductivity type impurity and extending from either end of the active region Rac to overlap each other in the central part of the active region Rac when viewed in cross section taken along the gate width direction, and a second low-concentration impurity diffusion region 9' containing boron as a first conductivity type impurity with a substantially uniform concentration.

The peripheral MIS transistor Mtrl located in the memory circuit formation region Rmemo includes a gate dielectric 21c provided on the semiconductor substrate 1 and made of a 2 nm-thick silicon oxide film, a gate electrode 22c whose gate length is 0.1 µm and that is provided on the gate dielectric 21c and made of a polysilicon film, a sidewall 26c covering the sides of the gate electrode 22c, source and drain regions 23c provided in the regions of the semiconductor substrate 1 located to both sides of the gate electrode 22c and containing N-type impurities, and a threshold-voltage-adjusting impurity diffusion region 24c provided between the source and drain regions 23c and containing P-type impurities with a concentration of $7 \times 10^{17}$ atoms·cm$^{-3}$. The source/drain region 23c is composed of an extension region containing N-type impurities with a concentration of $1 \times 10^{20}$ atoms·cm$^{-3}$ and a high-concentration source/drain region containing N-type impurities with a concentration of $1 \times 10^{21}$ atoms·cm$^{-3}$. In the threshold-voltage-adjusting impurity diffusion region 24c, there coexist two first low-concentration impurity diffusion regions 6' extending from either end of the active region Rac so as to be located apart from each other with the central part of the active region Rac interposed therebetween when viewed in cross section taken along the gate width direction, and a second low-concentration impurity diffusion region 9' containing boron as a first conductivity type impurity with a substantially uniform concentration. However, it can be considered that the impurity concentration of the threshold-voltage-adjusting impurity diffusion region 24c is substantially equivalent to that of the threshold-voltage-adjusting impurity diffusion region 24a located in the logic MIS transistor, because the area of the first low-concentration impurity diffusion regions 6' is much smaller than the whole area of the threshold-voltage-adjusting impurity diffusion region 24c.

When the threshold-voltage-adjusting impurity diffusion regions 24a, 24b and 24c of the MIS transistors are compared to one another, the threshold-voltage-adjusting impurity diffusion region 24b of the memory cell MIS transistor Mtrs contains a higher concentration of p-type impurities than the threshold-voltage-adjusting impurity diffusion region 24a of the logic MIS transistor Ltr and the threshold-voltage-adjusting impurity diffusion region 24c of the peripheral MIS transistor Mtrl. The reason is that the concentration of P-type impurities in the threshold-voltage-adjusting impurity diffusion region 24b of the memory cell MIS transistor Mtrs located in the memory circuit formation region Rmemo is equivalent to that obtained by adding the respective impurity concentrations of the two first low-concentration impurity diffusion regions 6' overlapping each other and the second low-concentration impurity diffusion region 9'.

Typically, in a process for fabricating a semiconductor device, boron in the threshold-voltage-adjusting impurity diffusion regions 24a through 24c is drawn into the silicon oxide film that is the isolation 7 during each of a thermal oxidation process step shown in FIG. 2D, the later thermal oxidation process step for forming a gate dielectric, a thermal process (RTA) for diffusing impurities as required, and the like. As a result, in particular, the degree of decrease of the boron concentration in the threshold-voltage-adjusting impurity diffusion region 24b of the memory cell MIS transistor Mtrs having a narrow gate width (i.e., a small area) is larger than that in each of the threshold-voltage-adjusting impurity diffusion regions 24a and 24c of the other MIS transistors Ltr and Mtrl having a relatively wide gate width.

However, according to the method for fabricating a semiconductor device of this embodiment, oblique ion implantation is utilized in the process step shown in FIG. 2C, wherein the substrate region to be formed with the memory cell MIS transistor Mtrs is subjected to ion implantation from the directions opposite to each other to form two first low-concentration impurity implantation regions 6 overlapping each other. Thus, when in the process step shown in FIG. 2E the second low-concentration impurity region 9 is formed in the logic circuit formation region Rlogc and the memory circuit formation region Rmemo under the same conditions, the active region Rac of the memory cell MIS transistor Mtrs has a higher impurity concentration than the respective active regions Rac of the logic MIS transistor Ltr and the peripheral MIS transistor Mtrl when viewed in cross section taken along the gate width direction. Therefore, even after impurities are diffused by the later thermal process, the impurity concentration in the threshold-voltage-adjusting impurity diffusion region 24b of the memory cell MIS transistor Mtrs is equivalent to or more than each of the impurity concentrations of the respective threshold-voltage-adjusting impurity diffusion regions 24a and 24c of the logic MIS transistor Ltr and the peripheral MIS transistor Mtrl in the status shown in FIGS. 3A and 3B even in consideration of absorption of boron into the isolation 7. Thus, according to a semiconductor device of this embodiment, compensation is provided for the decreased concentration of the threshold-voltage-adjusting impurity diffusion region 24b caused by boron being drawn into the isolation dielectric during the thermal process. As a result, the threshold voltage can be restrained from decreasing.

In the known art, it has been possible to make the amount of impurities implanted into the threshold-voltage-adjusting impurity diffusion region 24a of the logic MIS transistor Ltr different from the amount of impurities implanted into each of the impurity diffusion regions 24b and 24c of the memory cell MIS transistor Mtrs and the peripheral MIS transistor Mtrl. However, it has been difficult to make the amount of impurities implanted into the impurity diffusion region 24b of the memory cell MIS transistor Mtrs different from the amount of impurities implanted into the impurity diffusion region 24c of the peripheral MIS transistor Mtrl. The reason is that when the impurity diffusion regions 24b and 24c of the memory cell MIS transistor Mtrs and the peripheral MIS transistor Mtrl are subjected to ion implantation with different doses by using different implantation masks, various kinds of problems might occur in fact due to their proximity to each other.

On the other hand, in this embodiment, attention is directed toward the fact that the gate width of the memory cell MIS transistor Mtrs is much smaller than that of each of the logic MIS transistor Ltr and the peripheral MIS transistor Mtrl. In the process step shown in FIG. 2C, oblique ion implantation employing the protective dielectric 3a that is a common implantation mask is utilized to implant impurity ions into the substrate region to be formed with the memory cell transistor Mtrs having a small gate width from the directions opposite to each other, thereby forming two first low-concentration impurity implantation regions 6 to overlap each other. Therefore, even when ion implantation is made without using different implantation masks, the impurity concentration of the active region Rac of the memory cell MIS transistor Mtrs can be made higher than that of the active region Rac of the peripheral MIS transistor Mtrl when viewed in cross section taken along the gate width direction. Thus, the above effects can be achieved.

Figure 4:
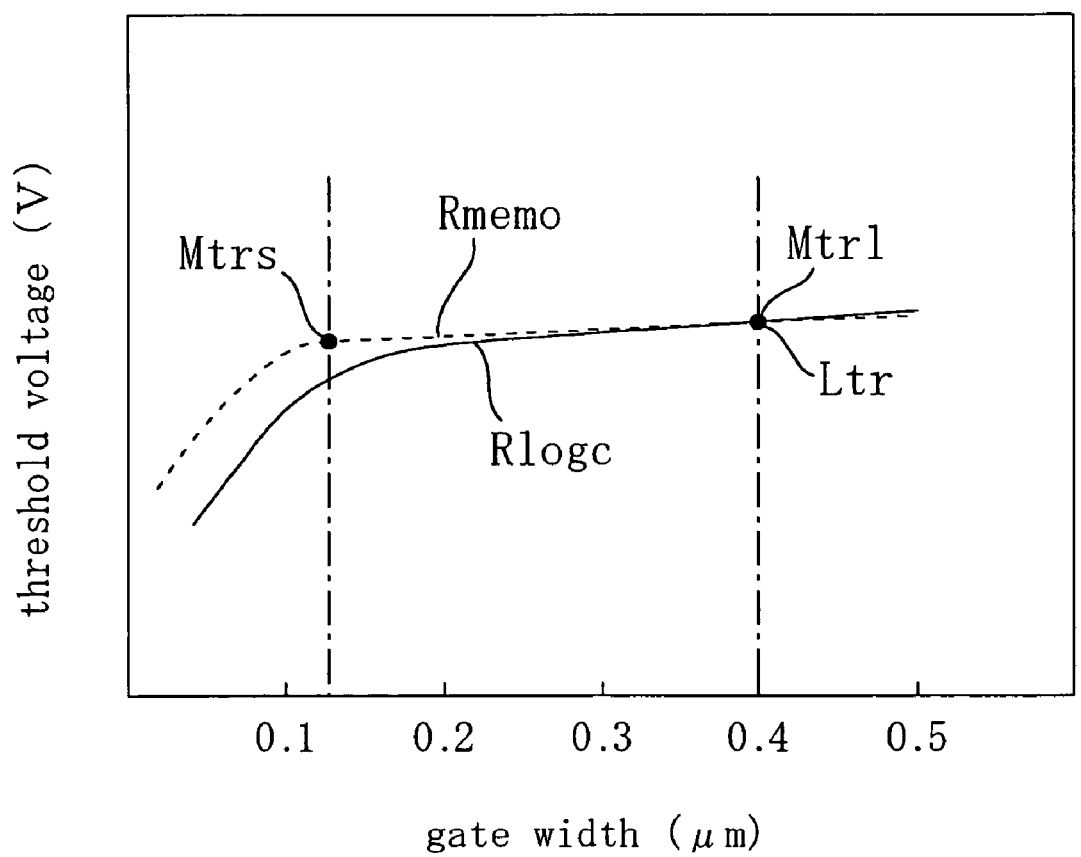
FIG. 4 is a graph showing the relationship between the gate width and the threshold voltage of each of MIS transistors in the semiconductor device according to the embodiment of the present invention.
Figure 5A:
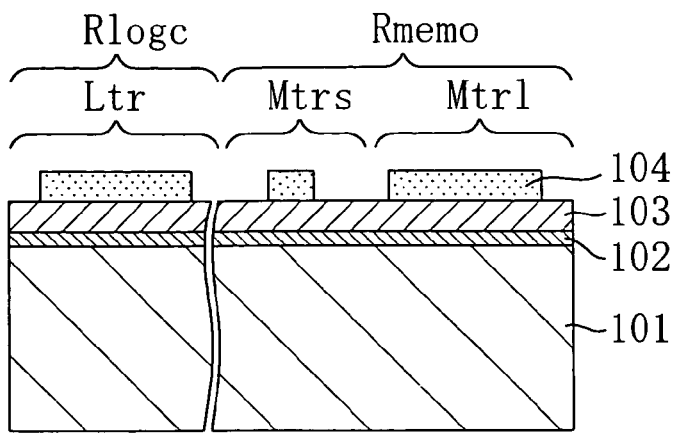
FIGS. 5A through 5E show known process steps for fabricating a semiconductor device in cross section taken along the gate width direction.
Figure 5B:
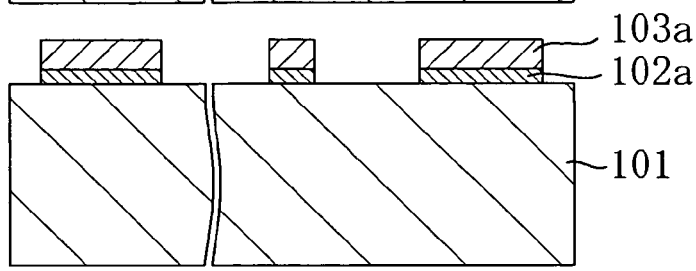
Figure 5C:
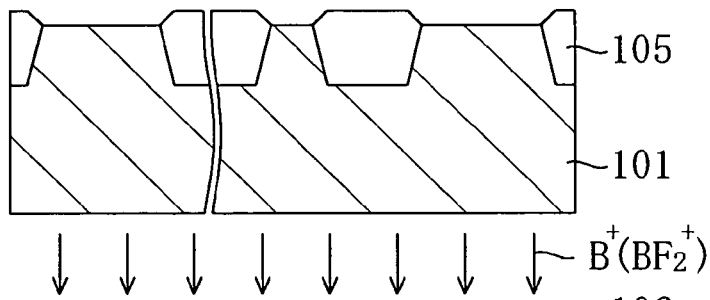
Figure 5D:
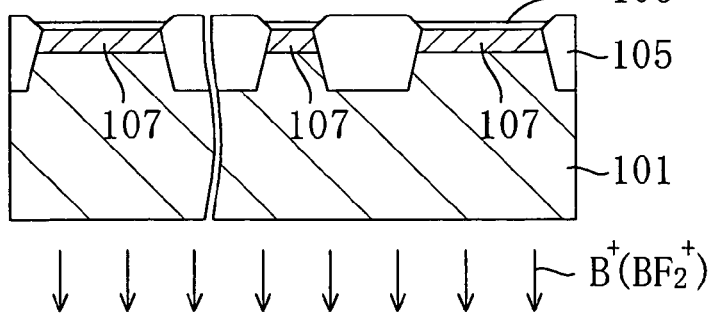
Figure 5E:
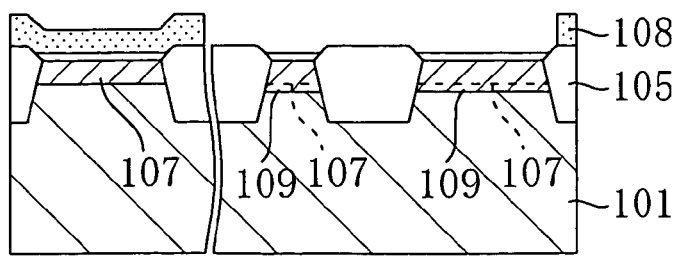
Figure 6:
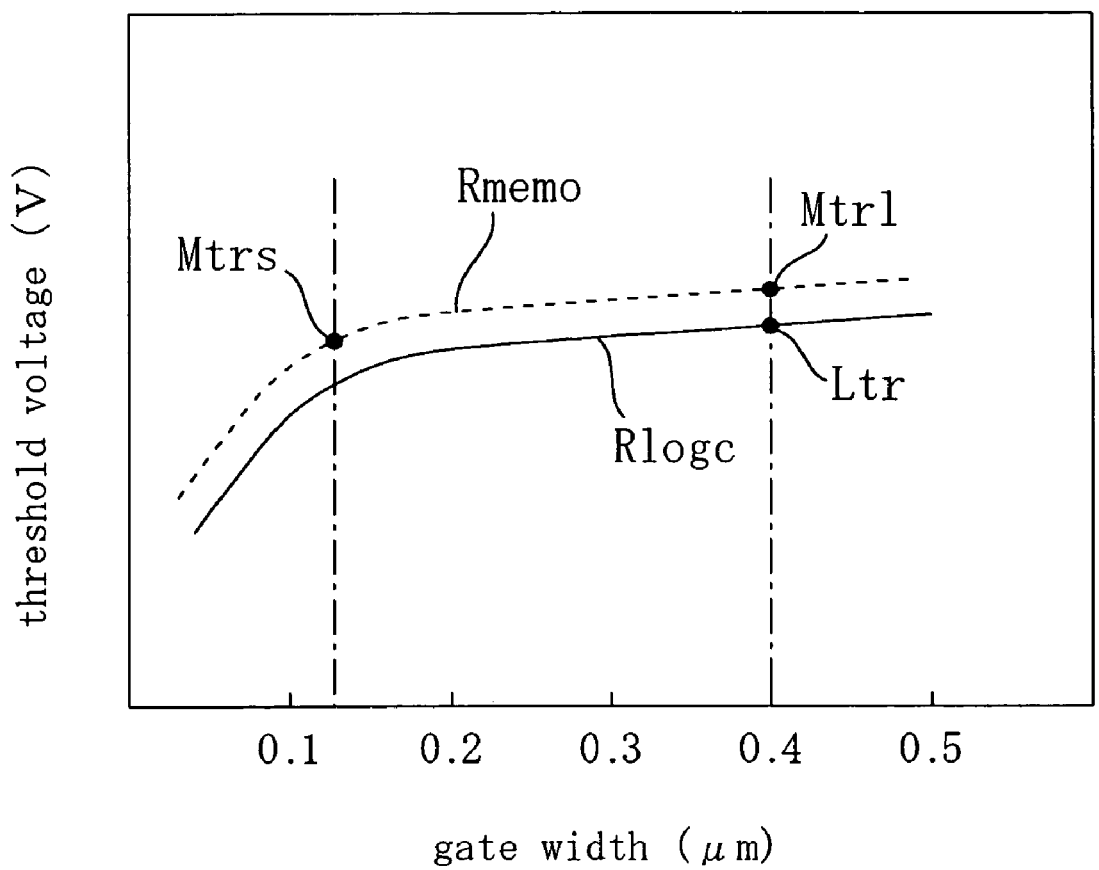
FIG. 6 is a graph showing the relationship between the gate width and the threshold voltage of each of MIS transistors formed using the known art.

FIG. 4 is a graph showing the relationship between the gate width and the threshold voltage of each of the MIS transistors in the semiconductor device according to the embodiment. As obvious from FIG. 4, the threshold voltage of the memory cell transistor Mtrs located in the memory circuit formation region Rmemo is substantially equivalent to that of the logic transistor Ltr when the gate width is 0.3 μm or more. However, in the case where the gate width is less than 0.3 μm, the threshold voltage of the MIS transistor located in the logic circuit formation region Rlogc drops as the gate width becomes narrower. This reason is considered as follows: boron is drawn into a silicon oxide film constituting an isolation 7. On the other hand, in the memory circuit formation region Rmemo, the overlapping amount of the two first low-concentration impurity implantation regions 6 shown in FIG. 2C increases as the gate width becomes narrower. Therefore, the amount of implanted impurities increases as the gate width becomes narrower. The increased amount of implanted impurities for threshold voltage adjustment (boron) resulting from a reduction in the gate width compensates for the amount of boron drawn into the isolation 7. Therefore, the threshold voltage can be restrained from decreasing. In other words, in the semiconductor device of this embodiment, when the gate width is 0.3 μm or less, a difference between the threshold voltage of each of the MIS transistors located in the memory circuit formation region Rmemo and that of the MIS transistor located in the logic circuit formation region Rlogc becomes larger as the gate width becomes narrower.

Consequently, as shown in FIG. 4, in the semiconductor device formed by the process steps of this embodiment, the threshold voltages of the logic MIS transistor Ltr, the memory cell MIS transistor Mtrs and the peripheral MIS transistor Mtrl are kept to be generally equivalent to one another. Thus, the reverse narrow channel phenomenon can be prevented from occurring in the memory cell MIS transistor having a narrow gate width while the threshold voltage of the peripheral MIS transistor having a wide gate width is restrained from increasing.

As shown in FIG. 4, when the gate width is 0.1 μm or less, the threshold voltage drops due to absorption of boron into the isolation 7 or the like. However, a pattern of changes of the threshold voltage with the gate width can be changed by adjusting the angle between the direction in which ions are implanted in the ion implantation process step shown in FIG. 2C and the direction vertical to the principal surface of the semiconductor substrate 1.

Referring to the above embodiment, in the process step shown in FIG. 2C, ions are implanted such that the two first low-concentration impurity implantation regions 6 overlap each other in the central part of the active region Rac when viewed in cross section taken along the gate width direction. However, as long as the two first low-concentration impurity implantation regions 6 come into contact with each other at this time, the two first low-concentration impurity diffusion regions 6' in which the impurities diffused from the two first low-concentration impurity diffusion regions 6 exist can overlap each other at the time that the process for fabricating a semiconductor device is completed. Thus, also in this case, the effects of the present invention can be achieved. However, the impurity concentration of the threshold-voltage-adjusting impurity diffusion region 24b is preferably as uniform as possible below the gate electrode in the stage where the whole process for fabricating a semiconductor device is completed. Although the conditions for thermal processes depend on types of semiconductor devices, typically, it is preferable that the two first low-concentration impurity implantation regions 6 overlap each other in the process step shown in FIG. 2C in order that the impurity concentration of the threshold-voltage-adjusting impurity diffusion region 24b can be uniform below the gate electrode. The reason is that there is no necessity to complicate the later conditions for thermal processes.

The ion implantation shown in FIG. 2C is preferably carried out from the direction inclined at 10° through 30° with respect to the direction vertical to the principal surface of the semiconductor substrate when viewed in cross section taken along the gate width direction. In addition, as the conditions of the ion implantation shown in FIG. 2C, an acceleration voltage (implantation energy) of 5 keV through 30 keV and a dose of $1\times10^{12}$ atoms·cm$^{-3}$ through $1\times10^{14}$ atoms·cm$^{-3}$ are typically used.

The thickness of the protective dielectric 3a is preferably within the range of 5 nm through 30 nm.

What is claimed is:

1. A semiconductor device comprising:
   a semiconductor substrate including a first active region and a second active region;

a first MIS transistor provided in the first active region and including a first gate electrode having a first gate width; and a second MIS transistor provided in the second active region and including a second gate electrode having a second gate width wider than the first gate width;

wherein the first MIS transistor includes, in the first active region below the first gate electrode, a first threshold-voltage-adjusting impurity diffusion region including two first impurity diffusion regions, which extend from both end parts of the first active region that are located in the gate width direction of the first gate electrode, and come into contact with each other in the central part of the first active region; and the second MIS transistor includes, in the second active region below the second gate electrode, a second threshold-voltage-adjusting impurity diffusion region including two second impurity diffusion regions, which extend from both end parts of the second active region that are located in the gate width direction of the second gate electrode, and located apart from each other with the central part of the second active region interposed therebetween.

2. The semiconductor device of claim 1, wherein the first threshold-voltage-adjusting impurity diffusion region of the first MIS transistor further includes, in the first active region below the first gate electrode, a third impurity diffusion region having a substantially uniform impurity concentration in the gate width direction of the first gate electrode.

3. The semiconductor device of claim 1, wherein the second threshold-voltage-adjusting impurity diffusion region of the second MIS transistor further includes, in the second active region below the second gate electrode, a third impurity diffusion region having a substantially uniform impurity concentration in the gate width direction of the second gate electrode.

4. The semiconductor device of claim 2, wherein the second threshold-voltage-adjusting impurity diffusion region of the second MIS transistor further includes, in the second active region below the second gate electrode, a fourth impurity diffusion region having a substantially uniform impurity concentration in the gate width direction of the second gate electrode.

5. The semiconductor device of claim 1, wherein:
the semiconductor substrate includes a third active region;
a third MIS transistor having a third gate electrode having a third gate width wider than the first gate width is provided in the third active region; and
the third MIS transistor includes, in the third active region below the third gate electrode, a third threshold-voltage-adjusting impurity diffusion region including a third impurity diffusion region having a substantially uniform impurity concentration in the gate width direction of the third gate electrode.

6. The semiconductor device of claim 5, wherein:
the semiconductor device comprises an SRAM including a memory cell region and a peripheral circuit, and a logic circuit;
the first MIS transistor is a memory cell transistor arranged in the memory cell region of the SRAM;
the second MIS transistor is a peripheral transistor arranged in the peripheral circuit of the SRAM; and
the third MIS transistor is a logic MIS transistor arranged in the logic circuit.

* * * * *